(12) United States Patent
Yaralioglu et al.

(10) Patent No.: US 8,686,555 B2
(45) Date of Patent: Apr. 1, 2014

(54) INTEGRATED HEATER ON MEMS CAP FOR WAFER SCALE PACKAGED MEMS SENSORS

(75) Inventors: Goksen G. Yaralioglu, Mountain View, CA (US); Martin Lim, San Mateo, CA (US)

(73) Assignee: Invensense, Inc., San Jose, CA (US)

(*) Notice: Subject to any disclaimer, the term of this patent is extended or adjusted under 35 U.S.C. 154(b) by 28 days.

(21) Appl. No.: 13/527,497

(22) Filed: Jun. 19, 2012

(65) Prior Publication Data
US 2013/0001765 A1    Jan. 3, 2013

Related U.S. Application Data

(60) Provisional application No. 61/502,643, filed on Jun. 29, 2011.

(51) Int. Cl.
*H01L 23/12* (2006.01)

(52) U.S. Cl.
USPC ........................................ 257/704; 438/199

(58) Field of Classification Search
USPC .................... 257/199, 459, 55, 254, 417, 415
See application file for complete search history.

(56) References Cited

U.S. PATENT DOCUMENTS

| | | | |
|---|---|---|---|
| 6,304,291 B1* | 10/2001 | Silverbrook | 348/187 |
| 7,340,956 B2* | 3/2008 | Deb et al. | 73/514.32 |
| 2004/0023429 A1* | 2/2004 | Foerstner et al. | 438/50 |
| 2010/0223981 A1* | 9/2010 | Johannessen | 73/64.47 |

* cited by examiner

*Primary Examiner* — Thao P. Le
(74) *Attorney, Agent, or Firm* — Sawyer Law Group, P.C.

(57) ABSTRACT

A system and method for controlling temperature of a MEMS sensor are disclosed. In a first aspect, the system comprises a MEMS cap encapsulating the MEMS sensor and a CMOS die vertically arranged to the MEMS cap. The system includes a heater integrated into the MEMS cap. The integrated heater is activated to control the temperature of the MEMS sensor. In a second aspect, the method comprises encapsulating the MEMS sensor with a MEMS cap and coupling a CMOS die to the MEMS cap. The method includes integrating a heater into the MEMS cap. The integrated heater is activated to control the temperature of the MEMS sensor.

20 Claims, 6 Drawing Sheets

INTEGRATED HEATER ON MEMS CAP FOR WAFER SCALE PACKAGED MEMS SENSORS

CROSS-REFERENCE TO RELATED APPLICATION

This application claims the benefit of U.S. Provisional Patent Application No. 61/502,643, filed on Jun. 29, 2011, entitled "INTEGRATED HEATER ON MEMS CAP FOR WAFER SCALE PACKAGED MEMS SENSORS," which is incorporated herein by reference in its entirety.

FIELD OF THE INVENTION

The present invention relates to Microelectromechanical Systems (MEMS) sensors, and more particularly, to a MEMS sensor that requires rapid heating for temperature characterization, calibration, and compensation.

BACKGROUND

MEMS sensors (e.g. accelerometers, gyros, compasses, pressure sensors, oscillators, etc.) require temperature compensation to reduce output signal changes that result from temperature variations. Conventional methods of temperature compensation are accomplished during production by measuring the output signal of each sensor at known temperatures, determining the temperature dependence of the output signals, and removing the effect of temperature variations by appropriate on chip or off line signal processing. In either case, the temperature dependence data is stored in a non-volatile memory inside the MEMS sensor.

The drawbacks of these conventional methods include the inefficient and time consuming process of establishing the response of the output signal to temperature variations by applying a known temperature to the MEMS sensor and measuring the resultant output signals. For high volume production, external heating of the MEMS sensor die is prohibitive due to lengthy heating time and complex test setup.

Therefore, there is a strong need for a cost-effective solution that overcomes the above issues by enabling fast and real-time temperature compensation that is achieved through an integrated heater. The present invention addresses such a need.

SUMMARY OF THE INVENTION

A system and method for controlling temperature of a MEMS sensor are disclosed. In a first aspect, the system comprises a MEMS cap encapsulating the MEMS sensor and a CMOS die coupled to the MEMS cap. The system includes a heater integrated into the MEMS cap. The integrated heater is activated to control the temperature of the MEMS sensor.

In a second aspect, the method comprises encapsulating the MEMS sensor with a MEMS cap and coupling a CMOS die to the MEMS cap. The method includes integrating a heater into the MEMS cap. The integrated heater is activated to control the temperature of the MEMS sensor.

BRIEF DESCRIPTION OF THE DRAWINGS

The accompanying figures illustrate several embodiments of the invention and, together with the description, serve to explain the principles of the invention. One of ordinary skill in the art will recognize that the particular embodiments illustrated in the figures are merely exemplary, and are not intended to limit the scope of the present invention.

DETAILED DESCRIPTION

The present invention relates to Microelectromechanical Systems (MEMS) sensors, and more particularly, to a MEMS sensor that requires rapid heating for temperature characterization, calibration, and compensation. The following description is presented to enable one of ordinary skill in the art to make and use the invention and is provided in the context of a patent application and its requirements. Various modifications to the described embodiments and the generic principles and features described herein will be readily apparent to those skilled in the art. Thus, the present invention is not intended to be limited to the embodiments shown but is to be accorded the widest scope consistent with the principles and features described herein.

A system and method in accordance with the present invention allows for quickly changing the temperature of a fabricated apparatus comprising a MEMS cap, a MEMS sensor, and/or a CMOS die to avoid inefficient external heating. By integrating a heater into the MEMS cap that encapsulates the MEMS sensor and controlling a current through the integrated heater by an external source or by the CMOS die, Joule heating causes the temperature of the heater to increase thereby increasing the temperature of the various components of the apparatus comprising the MEMS cap, the MEMS sensor, and/or the CMOS die. One of ordinary skill in the art readily recognizes that the apparatus can be fabricated using a variety of methodologies including but not limited to wafer scale packaging using the Nasiri Fabrication (NF) platform.

Due to the high thermal conductivity of the silicon of the MEMS cap, MEMS sensor, and CMOS die and their small masses, the time constant or the time to heat up the masses is very small thereby enabling rapid heating of the whole apparatus. This rapid heating enables more efficient testing and calibration processes of the whole MEMS apparatus to be conducted.

To describe the features of the present invention in more detail, refer now to the following description in conjunction with the accompanying Figures.

Figure 1:
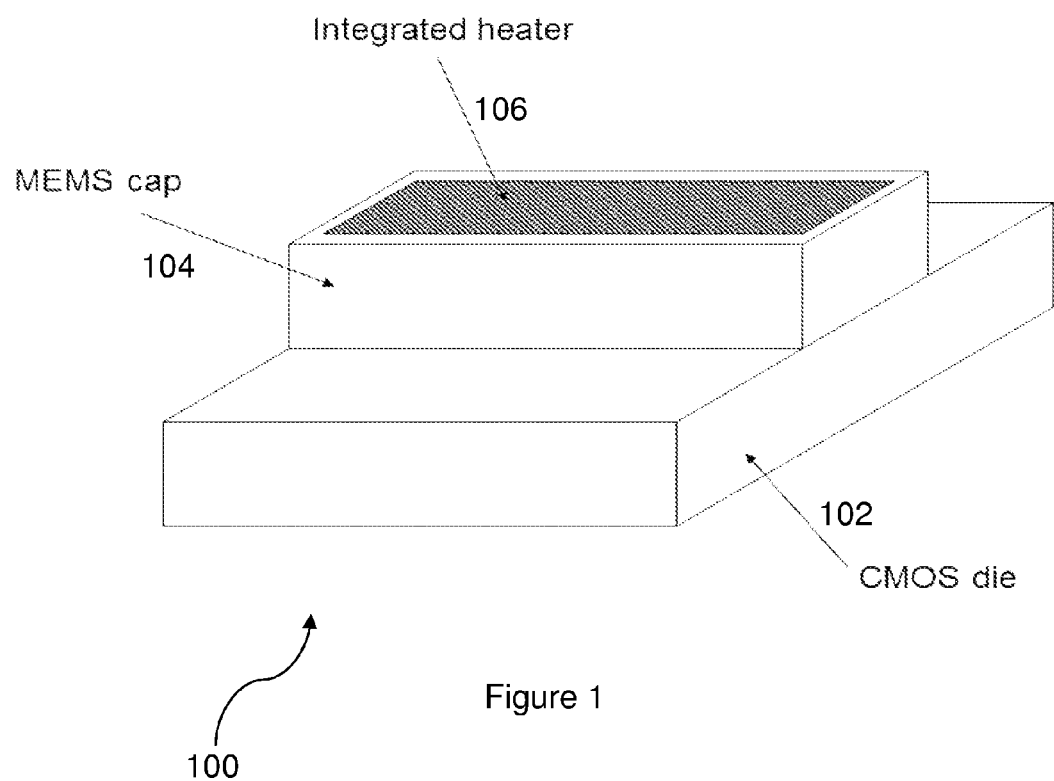
FIG. 1 illustrates a system for controlling temperature of a MEMS sensor in accordance with a first embodiment.

FIG. 1 illustrates a system 100 for controlling temperature of a MEMS sensor in accordance with a first embodiment. The system 100 includes a CMOS die 102, a MEMS cap 104 coupled to the CMOS die 102, and a heater 106 integrated into the MEMS cap 104. The MEMS cap 104 encapsulates the MEMS sensor. In one embodiment, the heater 106 is integrated into a top surface of the MEMS cap 104. By activating and/or deactivating the heater 106, the temperature of any of the MEMS cap 104, encapsulated MEMS sensor, and the CMOS die 102 can be increased and/or decreased respectively.

In one embodiment, the heater 106 is activated by applying a current through two terminals (not shown in FIG. 1) of the heater 106. Once the heater 106 is activated, the temperature of the heater 106 is increased due to Joule heating which in turn increases the temperature of the MEMS cap 104 and the CMOS die 102 coupled to the MEMS cap 104. The high thermal conductivity of the silicon components of the system 100 and the small masses involved in the system 100 results in a time constant that is very small including but not limited to the order of milliseconds. Accordingly, the system 100 is rapidly heated by the heater 106.

One of ordinary skill in the art readily recognizes that the heater 106 can be integrated into the MEMS cap 104 during production of the system 100 or post-production by an end-user and that would be within the spirit and scope of the present invention. In one embodiment, the MEMS cap 104 is made of a variety of materials including but not limited to silicon.

Figure 2:
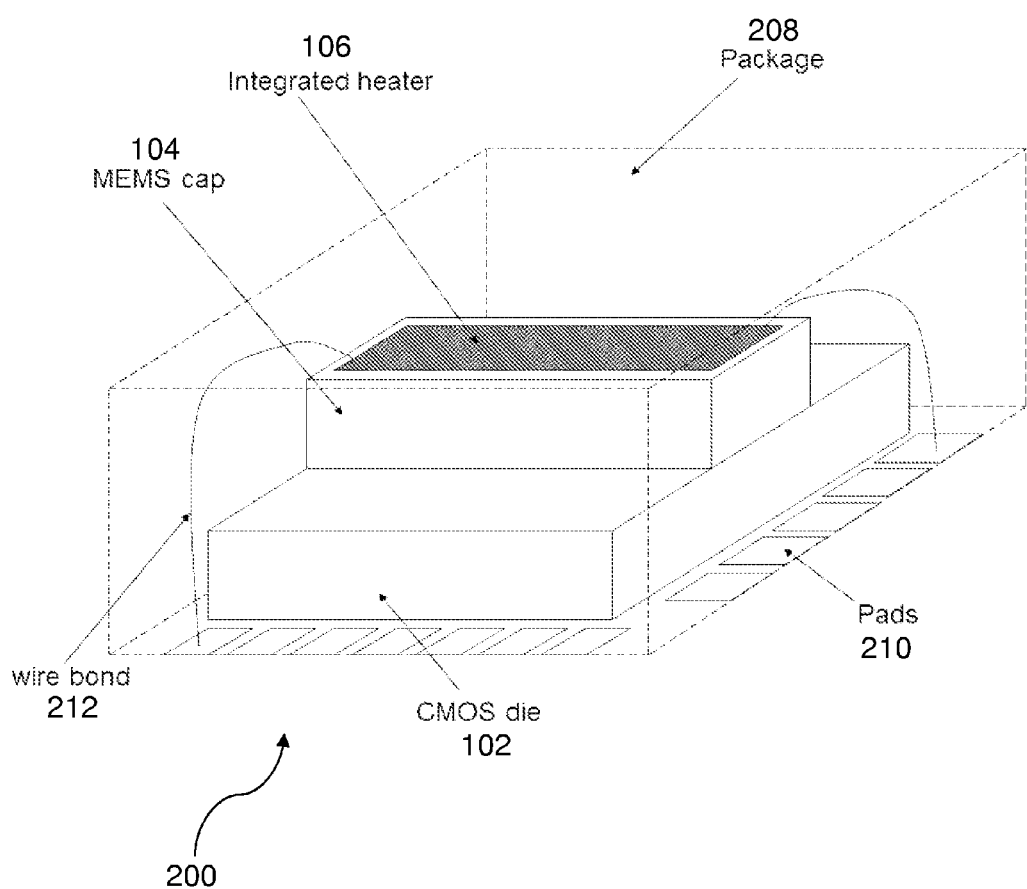
FIG. 2 illustrates a system for controlling temperature of a MEMS sensor in accordance with a second embodiment.

In one embodiment, the heater 106 is a resistive heater with terminals connected to either the CMOS die 102 via the MEMS cap 104 or directly to package pads. In this embodiment, the two terminal heater is integrated with the MEMS caps to allow current to pass across the two terminals to increase the temperature. FIG. 2 illustrates a system 200 for controlling temperature of a MEMS sensor in accordance with a second embodiment. The system 200 includes a CMOS die 102, a MEMS cap 104 coupled to the CMOS die 102, a heater 106 integrated into the MEMS cap 104, an outer package 208 housing the CMOS die 102, the MEMS cap 104, and the heater 106, and at least one package pad 210 connected to the assembly of the MEMS cap 104/CMOS die 102 structure via at least one wire bond 212.

By running a current through the heater 106, the heater 106 is activated to control the temperature of the system 200. The activation of the heater 106 is controlled by the CMOS die 102. In one embodiment, the CMOS die 102 includes a temperature sensor, an electronic circuit for measuring the temperature sensor's output signals, an electronic circuit for measuring the MEMS sensor's output signals, and an electronic circuit for energizing and/or activating the heater 106. In one embodiment, the on chip temperature sensor measures the temperature of the system 200. In another embodiment, an external thermocouple that is in contact with the top of the outer package 208 measures the temperature of the system 200.

One of ordinary skill in the art readily recognizes that the CMOS die 102 can include a variety of different types of electronic circuit components and that would be within the spirit and scope of the present invention. In another embodiment, the activation of the heater 106 is controlled by an external source. There are different ways to integrate the resistive heater into the MEMS cap including but not limited to micromachining and screen printing methodologies. In one embodiment, the resistive heater is an aluminum film deposited into a top surface of the MEMS cap. In this embodiment, the resistive heater is any material that conducts or semi-conducts current including but not limited to polysilicon, various metals, various metallic silicides, and other silicon based films, and resistive patches. In another embodiment, the resistive heater is a high resistance material including but not limited to a polymer with metal dust.

Figure 3:
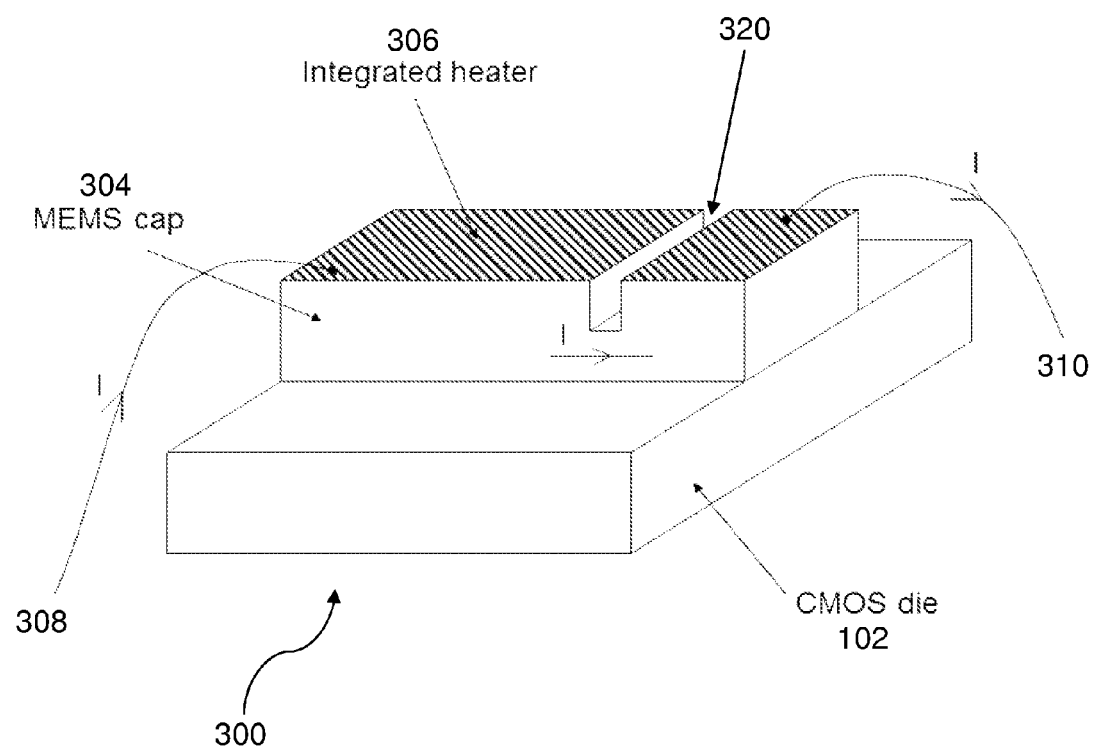
FIG. 3 illustrates a system for controlling temperature of a MEMS sensor in accordance with a third embodiment.

FIG. 3 illustrates a system 300 for controlling temperature of a MEMS sensor in accordance with a third embodiment. The system 300 includes a CMOS die 102, a silicon MEMS cap 304 coupled to the CMOS die 102, an aluminum film heater 306 integrated into the silicon MEMS cap 304, a first wire bond 308 coupled to a first terminal of the aluminum film heater 306, and a second wire bond 310 coupled to a second terminal of the aluminum film heater 306.

In one embodiment, the aluminum film heater 306 is deposited into a top surface of the silicon MEMS cap 304. In this embodiment, the aluminum film heater 306 is split into two discontinuous pieces by a cut 320 of varying degree including but not limited to a shallow cut and a deep cut. The cut provides a discontinuity in the aluminum film. The current path is then subject to pass through a portion of the silicon MEMS cap 304 in the region of the area of discontinuity. The resistance between the first and second heater terminals is determined by the doping level of the silicon MEMS cap 304. In one embodiment, the aluminum film heater 306 is deposited after implantation of the silicon MEMS cap 304 to get good contact between the deposited aluminum film heater 306 and the silicon MEMS cap 304.

One of ordinary skill in the art readily recognizes that between the first and second heater terminals, a variety of resistances and voltage differences can be utilized to determine the amount of power generated for heating of the aluminum film heater 306 and that would be within the spirit and scope of the present invention. Additionally, one of ordinary skill in the art readily recognizes that a variety of outer package masses and heating times can be utilized and that would be within the spirit and scope of the present invention.

In one embodiment, a resistance of 100 ohms and a 10 volt (V) voltage difference between the first and second heater terminals is assumed. Combining the equations Power (P)=Current (I)×Voltage (V) and I=V/Resistance (R), results in $P=V^2/R$ or 1 Watt of power being generated for the heating of the aluminum film heater 306. Additionally, in this embodiment, if the outer package housing the CMOS die 102, the silicon MEMS cap 304, and the aluminum film heater 306, is assumed to be mostly plastic with a specific heat of 1.2 Joules/Grams×Degree Celsius (J/g*C) and a total mass of 30 milligrams (mg), 5 seconds of heating the aluminum film heater 306 will result in a 140 degree C. temperature increase being achieved.

Figure 4:
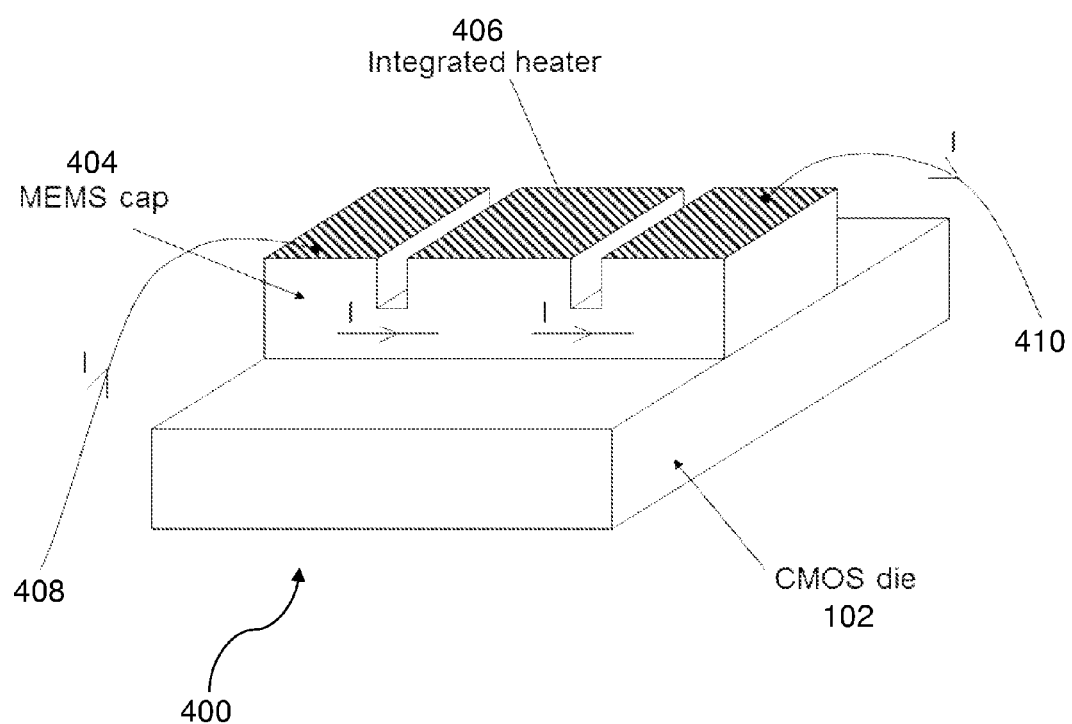
FIG. 4 illustrates a system for controlling temperature of a MEMS sensor in accordance with a fourth embodiment.

To alter the resistance between the first and second heater terminals and thus the duration required to heat the MEMS cap and/or CMOS die, additional cuts can be made into the heater that is integrated into the silicon MEMS cap. FIG. 4 illustrates a system 400 for controlling temperature of a MEMS sensor in accordance with a fourth embodiment. The system 400 resembles the system 300 of FIG. 3 and includes a CMOS die 102, a silicon MEMS cap 404 coupled to the CMOS die 102, a heater 406 integrated into the silicon MEMS cap 404, a first wire bond 408 coupled to a first terminal of the heater 406, and a second wire bond 410 coupled to a second terminal of the heater 406.

In one embodiment, the heater 406 integrated into the silicon MEMS cap 404 includes two cuts. One of ordinary skill in the art readily recognizes that a plurality of cuts can be utilized and that would be within the spirit and scope of the present invention. Additionally, the heater 406 resistance is maintained at a higher level than the other resistances along the current path so that enough power is dissipated across the heater 406 and external contacts and cables do not get hotter than the heater 406. The power dissipated by the heater 406 is $I^2×R$. If the heater 406 resistance is too small (e.g. <1 ohm), then heating circuitry could supply a current for Joule heating rather than supplying a voltage.

Figure 5:
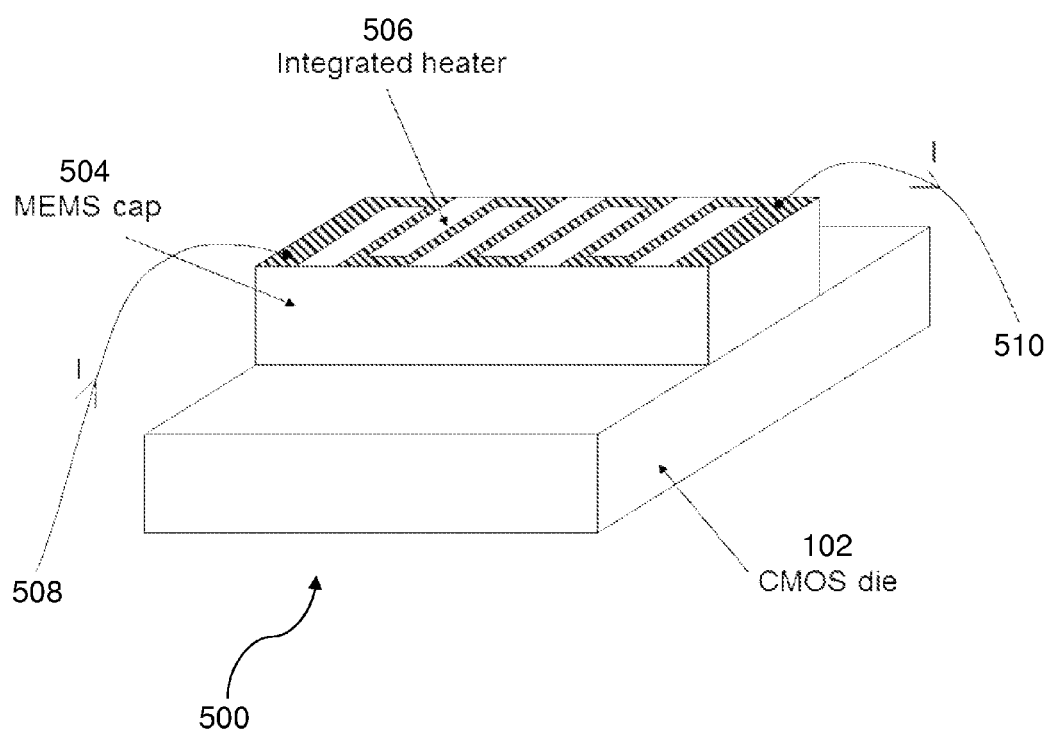
FIG. 5 illustrates a system for controlling temperature of a MEMS sensor in accordance with a fifth embodiment.

FIG. 5 illustrates a system 500 for controlling temperature of a MEMS sensor in accordance with a fifth embodiment. The system 500 includes a CMOS die 102, a MEMS cap 504 coupled to the CMOS die 102, a heater 506 integrated into the MEMS cap 504, a first wire bond 508 coupled to a first terminal of the heater 506, and a second wire bond 510 coupled to a second terminal of the heater 506. In one embodiment, the heater 506 comprises aluminum layers lithographically patterned on a top surface of the MEMS cap 504.

By lithographically patterning the aluminum layers, a resistive heater with desired resistance is attained. In one embodiment, the top surface area of the MEMS cap 504 is 2 millimeters (mm) by 1 mm and 10 segments of 1 mm long aluminum layers are lithographically patterned on the top surface of the MEMS cap 504. In this embodiment, assuming the resistivity of aluminum is 2.81 ohm×meter and the aluminum layers have 4 micron widths and 1 micro thicknesses, the resistance of the heater 506 is 70 ohms.

Figure 6:
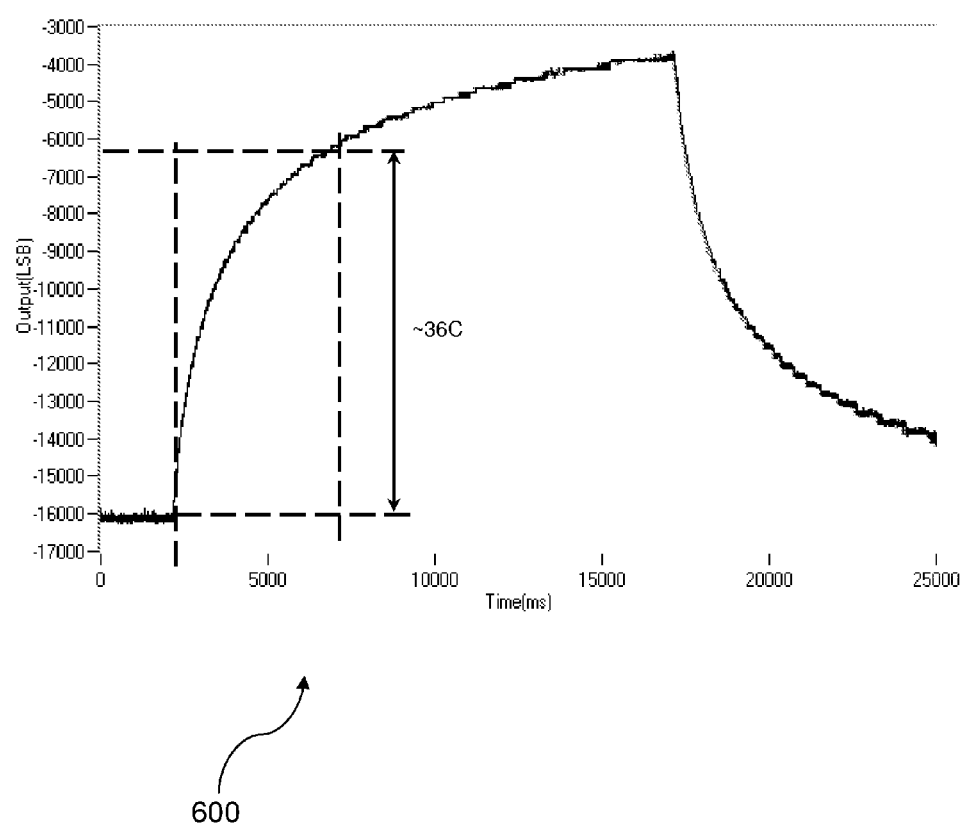
FIG. 6 illustrates a diagram showing a temperature rise in a CMOS die in accordance with an embodiment.

FIG. 6 illustrates a diagram 600 showing a temperature rise in a CMOS die in accordance with an embodiment. The temperature rise is measured by a temperature sensor within CMOS die circuitry or coupled externally to the CMOS die. In the diagram 600, the resistance of the heater integrated into the MEMS cap is adjusted to be 200 ohms and the vertical scale is 1 Celsius (C)=280 least significant bits (LSB). When an external power supply of 10 V is connected to the heater, the temperature of the CMOS die increases rapidly and within 5 seconds, an approximately 36 degree Celsius temperature rise is achieved.

As above described, the system and method allow for rapidly controlling temperature compensation of wafer scale packaged MEMS sensors to more efficiently and more accurately measure and calibrate component signal outputs of the whole MEMS apparatus. By integrating a heater into the MEMS cap of the wafer scale packaged MEMS sensor, temperature compensation in volume production of MEMS sensors can achieve temperature rises in approximately one second without the usage of complicated equipment. In comparison, conventional methods typically require approximately 20-30 seconds for the temperature rises and use complicated equipment such as well isolated ovens and/or contact heaters.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for controlling temperature of a MEMS sensor, the system comprising:
 a MEMS cap encapsulating the MEMS sensor;
 a CMOS die vertically arranged to the MEMS cap; and
 a heater integrated into the MEMS cap, wherein the integrated heater is activated to control the temperature of the MEMS sensor.

2. The system of claim 1, further comprising:
 a wafer scale package fabricated to encapsulate the MEMS sensor, the MEMS cap with integrated heater, and the CMOS die.

3. The system of claim 2, wherein terminals of the integrated heater are connected directly to at least one pad of the wafer scale package via at least one wire bond.

4. The system of claim 1, wherein terminals of the integrated heater are connected to the CMOS die via the MEMS sensor.

5. The system of claim 1, wherein the MEMS cap is a silicon MEMS cap and the integrated heater is a bulk silicon single crystal resistive element.

6. The system of claim 1, wherein a current applied to activate the integrated heater is controlled by any of an external source and the CMOS die.

7. The system of claim 1, wherein the integrated heater comprises:
 an aluminum deposit on a top surface of the MEMS cap, wherein the MEMS cap is cut to separate the aluminum deposit into two discontinuous pieces.

8. The system of claim 1, wherein the integrated heater comprises:
 an aluminum deposit on a top surface of the MEMS cap, wherein the MEMS cap is cut to separate the aluminum deposit into a plurality of discontinuous pieces.

9. The system of claim 1, wherein the integrated heater comprises:
 a lithographically patterned aluminum deposit on a top surface of the MEMS cap to implement a desired resistance.

10. The system of claim 1, wherein the integrated heater comprises:
 a high resistance material deposit on a top surface of the MEMS cap.

11. The system of claim 10, wherein the high resistance material deposit is a polymer with metal dust.

12. A method for controlling temperature of a MEMS sensor, the method comprising:
 encapsulating the MEMS sensor with a MEMS cap;
 coupling a CMOS die to the MEMS cap;
 integrating a heater into the MEMS cap; and
 activating the integrated heater to control the temperature of the MEMS sensor.

13. The method of claim 12, further comprising:
 fabricating a wafer scale package to encapsulate the MEMS sensor, the MEMS cap with integrated heater, and the CMOS die.

14. The method of claim 13, further comprising:
 connecting terminals of the integrated heater to at least one pad of the wafer scale package via at least one wire bond.

15. The method of claim 12, further comprising:
 connecting terminals of the integrated heater to the CMOS die via the MEMS sensor.

16. The method of claim 12, further comprising:
 controlling a current applied to activate the integrated heater by any of an external source and the CMOS die.

17. The method of claim 12, wherein the integrated heater is an aluminum deposit on a top surface of the MEMS cap, further comprising:
 cutting the MEMS cap to separate the aluminum deposit into two discontinuous pieces.

18. The method of claim 12, wherein the integrated heater is an aluminum deposit on a top surface of the MEMS cap, further comprising:
 cutting the MEMS cap to separate the aluminum deposit into a plurality of discontinuous pieces.

19. The method of claim 12, wherein the integrated heater is an aluminum deposit on a top surface of the MEMS cap, further comprising:
 lithographically patterning the aluminum deposit on the top surface of the MEMS cap to implement a desired resistance.

20. The method of claim 13, further comprising:
 measuring a temperature of the wafer scale package using any of a chip sensor of the CMOS die and an external thermocouple in contact with the wafer scale package.

* * * * *